(12) United States Patent
Ghadaksaz

(10) Patent No.: US 7,982,480 B2
(45) Date of Patent: Jul. 19, 2011

(54) CALIBRATED WIDEBAND HIGH FREQUENCY PASSIVE IMPEDANCE PROBE

(75) Inventor: Michael M. Ghadaksaz, Inverness, IL (US)

(73) Assignee: AES Technologies, Inc., Schaumburg, IL (US)

( * ) Notice: Subject to any disclaimer, the term of this patent is extended or adjusted under 35 U.S.C. 154(b) by 0 days.

(21) Appl. No.: 12/221,466

(22) Filed: Aug. 1, 2008

(65) Prior Publication Data

US 2011/0102007 A1    May 5, 2011

(51) Int. Cl.
G01R 1/067    (2006.01)

(52) U.S. Cl. .................................. 324/755.02

(58) Field of Classification Search .............. 324/755.02
See application file for complete search history.

(56) References Cited

U.S. PATENT DOCUMENTS

| | | | |
|---|---|---|---|
| 5,418,506 A * | 5/1995 | Mahnad ........................ | 333/134 |
| 6,281,690 B1 * | 8/2001 | Frey .......................... | 324/754.07 |
| 7,042,236 B1 * | 5/2006 | Wollitzer ................... | 324/755.02 |
| 7,053,643 B2 * | 5/2006 | Ruff et al. ................. | 324/755.02 |
| 7,271,603 B2 * | 9/2007 | Gleason et al. .......... | 324/750.26 |
| 7,281,947 B2 * | 10/2007 | Pescatore ..................... | 439/578 |
| 7,285,969 B2 * | 10/2007 | Hayden et al. ........... | 324/754.09 |
| 7,347,129 B1 * | 3/2008 | Youtsey ........................ | 81/467 |
| 7,362,112 B2 * | 4/2008 | Yang et al. ............... | 324/755.02 |
| 7,452,237 B1 * | 11/2008 | Montena ....................... | 439/578 |
| 7,489,149 B2 * | 2/2009 | Gleason et al. ........... | 324/750.26 |
| 7,504,837 B2 * | 3/2009 | Tamaki et al. ............. | 324/724 |
| 7,518,387 B2 * | 4/2009 | Gleason et al. .......... | 324/755.11 |
| 7,544,094 B1 * | 6/2009 | Paglia et al. ............... | 439/585 |
| 2005/0164553 A1 * | 7/2005 | Montena ........................ | 439/578 |
| 2005/0212541 A1 * | 9/2005 | Ruff et al. ..................... | 324/761 |
| 2007/0182429 A1 * | 8/2007 | Goeke ........................... | 324/754 |
| 2008/0066584 A1 * | 3/2008 | Vines ........................... | 81/124.2 |
| 2010/0130070 A1 * | 5/2010 | Isaac et al. ................... | 439/680 |

* cited by examiner

Primary Examiner — Ha Tran T Nguyen
Assistant Examiner — Joshua Benitez
(74) Attorney, Agent, or Firm — Patents and Licensing LLC; Daniel W Juffernbruch

(57) ABSTRACT

A calibrated passive impedance probe has a wide bandwidth operating range for impedance and performance measurements of RF and microwave components, devices, and circuits in 50Ω and 75Ω environments. The probe is calibrated at the probe tip, thus allowing accurate impedance and performance measurements of in-circuit functions and on-board components. The calibrated probe can be used to eliminate RF connectors and provide input and output connections to a circuit board for prototype design and quick performance verification thus realizing cost savings on RF connectors. The probe includes a semi-rigid coaxial cable assembly filled with dielectric material, a silver plated center conductor, and silver plated ground outer conductor having an SMA male connector on one end and exposed center conductor at the opposite end and having uniform characteristic impedance of 50Ω or 75Ω along the cable length; a hexagonal shaped body made of anodized aluminum having raised texture on the surface for sure handling; a probe tip of gold plated aluminum with two spring loaded ground pins; a four-finger threaded cable catch for locking semi-rigid coaxial cable assembly inside the tip and for ground continuity from cable to spring loaded pins; an interface RF connector-adapter including SMA female-SMA female, BNC-SMA female, or Type N-SMA female; a locking nut to hold and lock cable assembly and connector-adapter inside the probe body; and 50Ω and 75Ω precision loads for probe calibration.

15 Claims, 10 Drawing Sheets

902    904

Fig. 15
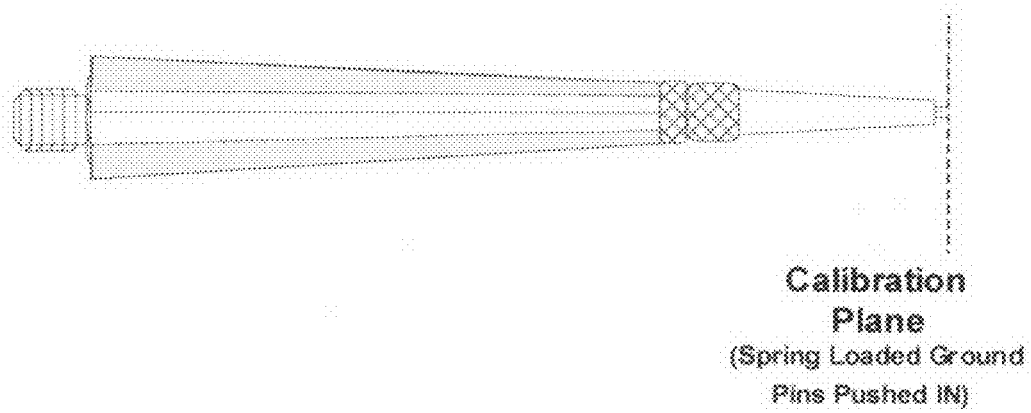
Calibration Plane
(Spring Loaded Ground Pins Pushed IN)
Calibration Process   Fig. 16
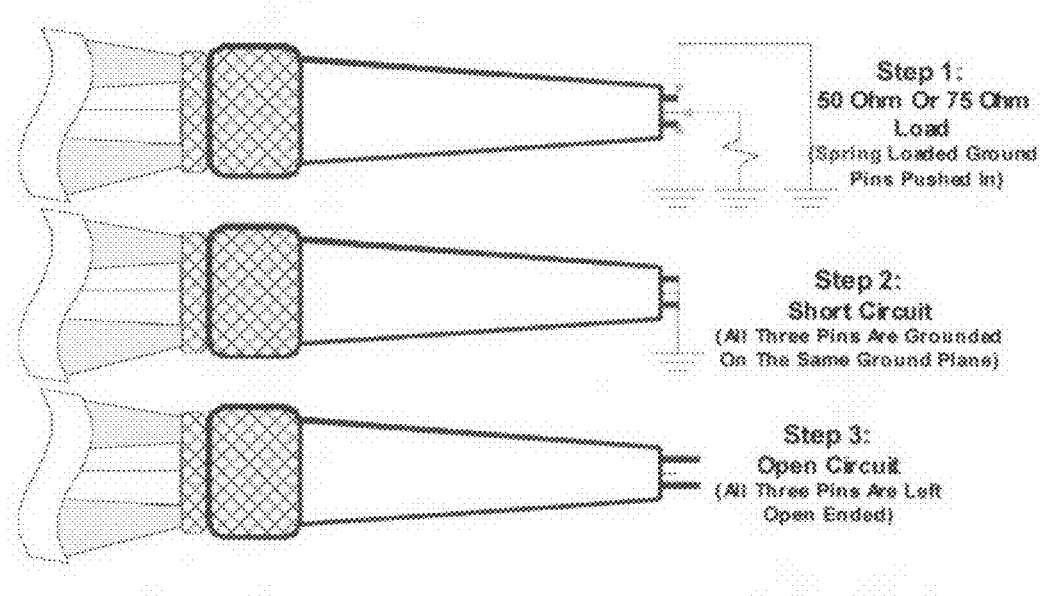
Step 1:
50 Ohm Or 75 Ohm Load
(Spring Loaded Ground Pins Pushed In)
Step 2:
Short Circuit
(All Three Pins Are Grounded On The Same Ground Plane)
Step 3:
Open Circuit
(All Three Pins Are Left Open Ended)

Fig. 17A

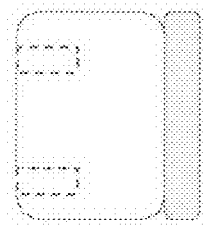

Side View

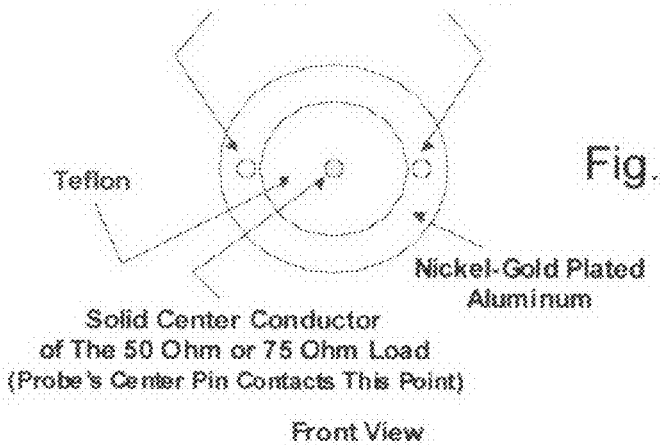

Ground Holes
(Probe's Spring Loaded Ground Pins
are Inserted Into These Holes)

Teflon

Fig. 17B

Nickel-Gold Plated
Aluminum

Solid Center Conductor
of The 50 Ohm or 75 Ohm Load
(Probe's Center Pin Contacts This Point)

Front View

Short Circuit Plug
For Probe Calibration

Fig. 18A

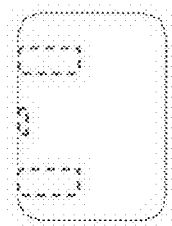

Side View

Fig. 18B

Blind Ground Holes
(Probe's Spring Loaded Ground Pins
are Inserted Into These Holes)

Nickel-Gold Plated
Aluminum

Shallow Blind Ground Hole
For probe's Center Pin
(Probe's Center Pin Contacts This Point)

Front View

CALIBRATED WIDEBAND HIGH FREQUENCY PASSIVE IMPEDANCE PROBE

FIELD OF INVENTION

The present invention relates generally to the field of electronic test and measurement, and more particularly relates to an assembly for a 50 Ohm passive probe.

BACKGROUND

It is well-known that measurement, characterization, and testing of electronic circuits are necessary aspects of developing, debugging, and manufacturing electronic products. Typically a test probe is used to make electrical contact with one or more terminals of an electronic circuit, and provide an electrical pathway between that electronic circuit and externally deployed Measurement, characterization, and/or testing equipment. For products that operate at high speeds, it is also known that the impedance of the test probe becomes an important parameter.

It is highly desirable to measure the effective value of passive components (e.g., chip capacitors, inductors, resistors) both at specific frequencies and over specific frequency bands for which those components are being considered. Component manufacturers' data sheets typically publish impedance or component values at only certain low frequencies, typically in the 1 to 100 MHz range, and very seldom at 1 GHz. The effective values of such components at high frequencies, i.e., above 100 MHz, and particularly in the GHz range, vary from their low frequency values due to package parasitics, lead inductance, and fringe capacitance. The users of such components need to measure the effective values these components present to a circuit at specific design frequencies, or over the desired frequency band. High frequency impedance measurement systems are typically very expensive and range in the tens of thousand of dollars. Most RF and microwave designers often use network or vector analyzers that are widely used in the RF and microwave engineering labs, and design their own makeshift tools by stripping the end of a microwave test cable and soldering the center conductor to a circuit board where the target component can be mounted and tested. To make the measurements somewhat accurate, the tip of the test cable must be calibrated. The calibration process often involves a laborious and time consuming process of soldering and de-soldering the cable tip several times to terminate the center conductor into a 50 ohm or 75 ohm load, short and open circuits. Alternatively, some designers use four individual sections of microwave test cables of equal length with each section having a type N or SMA connector on one end, and stripped center conductor at the opposite end. A first section is soldered to a printed circuit board and having its stripped center conductor terminated into a 50 ohm or 75 ohm resistive load previously mounted on a printed circuit board. A second section is soldered to a second circuit board and its stripped center conductor tip is shorted circuited to ground. The third section is soldered to a third circuit board with its stripped center conductor soldered to a small open circuited microstrip transmission line. These three sections now provide the calibration set. A common long test cable is then used to connect a network analyzer to each of these three cable-board assemblies for calibration. A fourth section is soldered to a fourth printed circuit board where the component or device under test will be soldered for an impedance measurement.

In addition to the testing and/or characterization of components, vendor-supplied RF and microwave circuits, and modules such as filters, attenuators, voltage controlled oscillators, amplifiers, an so on, are almost always tested and evaluated for performance verification and qualification by engineering personnel and design engineers before such circuits and devices are used in new product design. Often large sample quantities are tested. Further, in production and quality control, these devices are also often tested. For testing, circuits and devices as well as modules are normally placed on printed circuit boards, and RF connectors are soldered at input and output ports to provide external interfaces for connection to test cables.

Prototype and engineering circuits require RF connectors at input and output ports. These connectors, which are relatively expensive especially in small quantities, must be soldered to the printed circuit boards. If the boards are damaged or circuits need to be redesigned which is often the case during prototype stage, RF connectors cannot often be salvaged and after several soldering cycles, removing, and mounting again to multiple printed circuit boards they are rendered useless, or no longer reliable for future use. Once RF connectors such as SMAs are soldered to a circuit board, they can easily be damaged when they are removed from the circuit board by overheating the solder joints.

What is needed are low-cost, high frequency passive probe assemblies that are operable to be calibrated without consuming valuable RF connectors in the process of calibration.

SUMMARY OF THE INVENTION

Briefly, a calibrated high frequency passive impedance probe includes a high-quality low-loss semi-rigid coaxial cable assembly filled with a dielectric material, such as Teflon, and having a silver plated center conductor and silver plated ground outer conductor (jacket) having an SMA male connector on one end and stripped center conductor at the opposite end, and having uniform characteristic impedance along the cable length; a hexagonal shaped body made of black anodized aluminum having raised texture on the surface for maximum grip while holding the probe during testing; a probe tip made of gold plated aluminum with two spring loaded ground pins; a four-finger threaded cable catch for locking the semi-rigid coaxial cable assembly inside the probe tip and for ground continuity from cable to spring loaded pins; a locking nut for securing the cable assembly and the SMA connector inside the probe body; and an SMA RF connector-adapter for interface to test cables.

BRIEF DESCRIPTION OF THE DRAWINGS

FIG. 15 illustrates the calibration plane of a high frequency passive impedance probe in accordance with the present invention, in which the spring-loaded ground pins are pushed in.

FIG. 16 illustrates the loaded, short-circuited, and open-circuited configurations of an exemplary high frequency passive impedance probe in accordance with the present invention.

FIGS. 17A and 17B illustrate, respectively, side and front views of a precision load for calibration of the high frequency passive impedance probe.

FIGS. 18A and 18B illustrate, respectively, side and front views of short circuit plug for calibration of the high frequency passive impedance probe.

Figure 1:
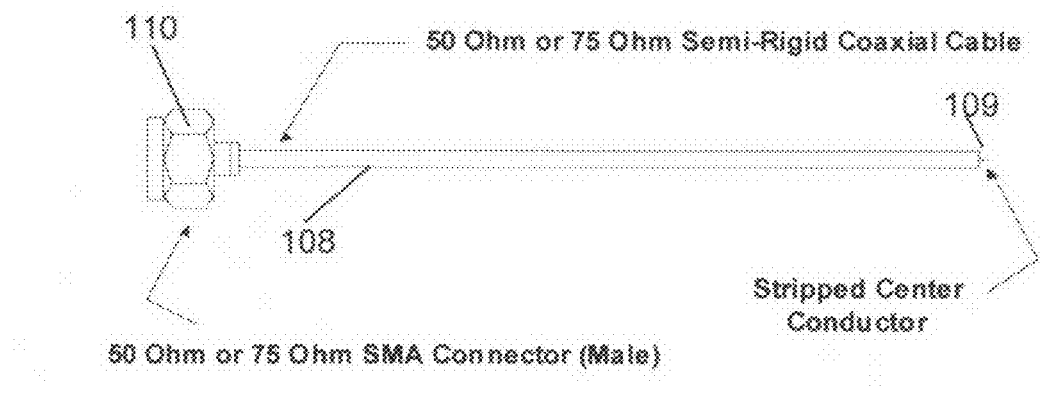
FIG. 1 illustrates a semi-rigid coaxial cable assembly that forms part of the high frequency wideband impedance probe in accordance with the present invention.

The present invention eliminates this and similar time consuming and laborious methods of impedance measurements which often involve inaccuracies and result in non-repeatable measurements by providing a simple to use and most cost effective calibrated impedance probe system for nondestructive, repeatable and rapid impedance and performance measurements of RF and Microwave chip components, devices, and circuits.

DETAILED DESCRIPTION

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Generally, an apparatus is provided that is suitable for the purpose of test, characterization, and measurement of electronic components and circuits. More particularly, a calibrated high frequency wide bandwidth passive probe, which is simple to produce and assemble is provided. A passive does not include active components and so power is not required to be provided to a probe in accordance with the present invention.

Embodiments of the present invention provide easy access to test points on a circuit board for in-circuit and on-board testing of RF functions and impedance measurements of RF components, devices and circuits already mounted or soldered on the printed circuit board.

As noted above, conventional methods of calibrating a probe can result in the loss of expensive connectors, as well as the loss of valuable engineering time. Various embodiments of the present invention eliminate the need for RF connectors, soldering, and removing connectors from circuit boards. By using two calibrated high frequency passive probes with one as input port and another as output port when connected to vector network and spectrum analyzers reliable and rapid RF connections can be provided to RF and microwave circuits during, for example, a prototype design stage for rapid, accurate, repeatable and cost effective performance measurements. Once performance is verified, and assurance is obtained that no more changes to the circuit will be required, RF connectors can then be used and soldered permanently to the board if need be to create a final reference design.

Various embodiments of the present invention offer an economical solution for rapid testing of RF and microwave circuits, components, devices, and modules. These embodiments can eliminate RF connectors and in most cases circuit boards and RF test fixtures and enable direct and rapid testing of RF and microwave components, devices, and circuits in production.

Calibrated high-frequency probes in accordance with the present invention may be used to measure load and source impedance of high power RF and microwave transistors. Because of its passive construction the present invention can also handle high RF and microwave power exceeding 100 watts.

Terminology

SMA is an acronym for SubMiniature version A, and refers to a well-known coaxial RF connector.

BNC is an acronym for Bayonet Neill-Concelman, and refers to another very well known RF connector.

Type N connector refers to a threaded RF connector suitable for connecting coaxial cables.

Referring to FIG. 1, a semi-rigid coaxial cable assembly that forms part of the high frequency wideband impedance probe in accordance with the present invention is shown. The assembly includes a semi-rigid coaxial cable 108, a stripped center conductor 109 at a first end of semi-rigid coaxial cable 108, and an SMA male connector 110 at a second end of semi-rigid coaxial cable 108. It is noted the coaxial cable 108 and SMA connector 110 may be paired as each being 50Ω or each being 75Ω.

Figure 2:
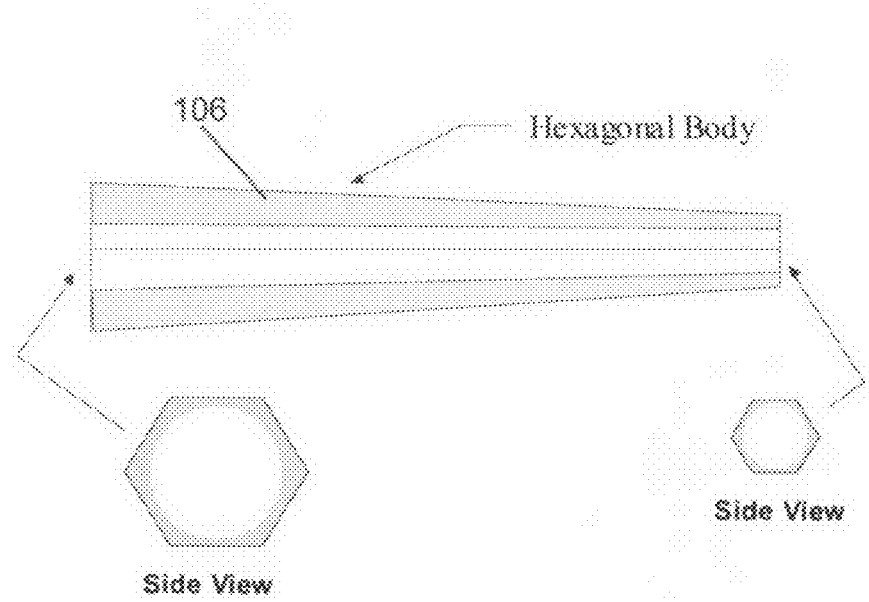
FIG. 2 illustrates a hexagonal probe body that forms part of the high frequency wideband impedance probe in accordance with the present invention.

Referring to FIG. 2, a hexagonal probe body that forms part of the high frequency wideband impedance probe in accordance with the present invention is shown. More particularly, a cross-section of a hexagonal body 106 is shown.

Figure 3:
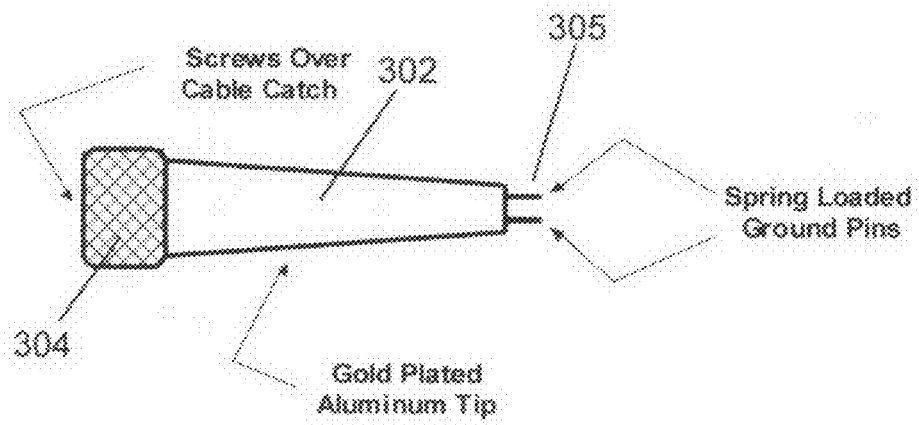
FIG. 3 illustrates a probe tip with spring loaded ground pins that forms part of the high frequency wideband impedance probe in accordance with the present invention.

FIG. 3 illustrates a probe tip 302 with spring loaded ground pins 305 that forms part of the high frequency wideband impedance probe in accordance with the present invention. Probe tip 302 has a collar 304 that screws over a cable catch (not shown in FIG. 3).

Figure 4:
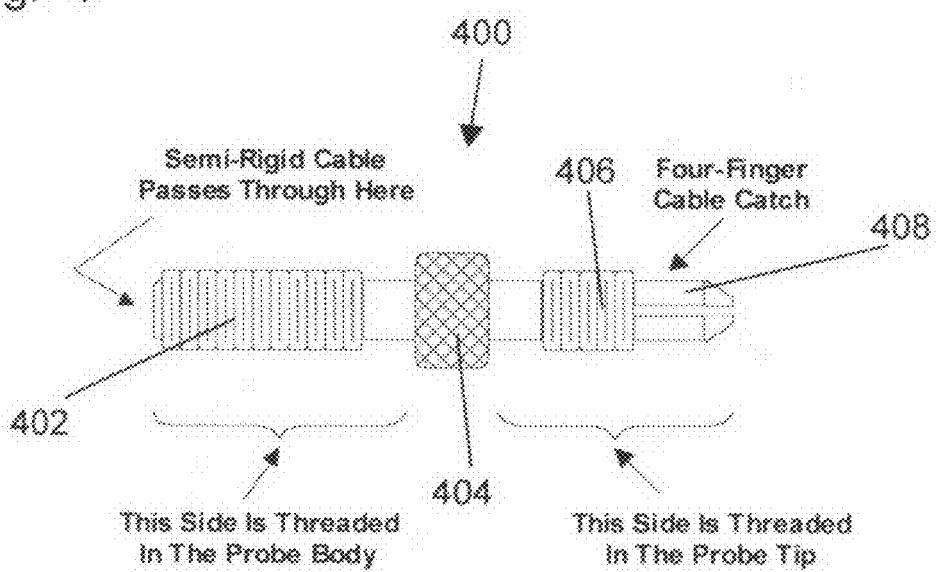
FIG. 4 illustrates a four-finger semi-rigid cable catch that forms part of the high frequency wideband impedance probe in accordance with the present invention.

Referring to FIG. 4, a component 400 including a four-finger semi-rigid cable catch 408 that forms part of the calibrated high frequency wideband impedance probe in accordance with the present invention is shown. Four-finger cable catch 408 is disposed at a first end of component 400. Adjacent four-finger cable catch 408 is a threaded section 406 which screws into probe tip 302. A central portion 404 of component 400 separates threaded section 406 from a second threaded portion 402. Threaded portion 402 screws into probe body 106. It is noted that semi-rigid coaxial cable 108, is passed through an opening in component 400 such that stripped center conductor 109 through four-finger cable catch 408.

Figure 5:
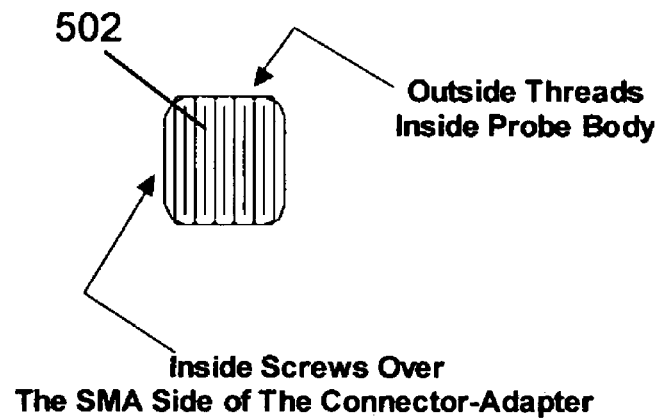
FIG. 5 illustrates a locking nut designed to secure an SMA side of a connector-adapter, and the cable in the probe body.

FIG. 5 illustrates a locking nut 502 designed to secure an SMA side of a connector-adapter, and the cable in the probe body. It is noted that the threads on the outer surface of locking nut 502 engage the inside portion of probe body 106, and the threads on the inner surface of locking nut 502 engage with the threaded outer surface of the SMA side of a connector-adapter.

Figure 6:
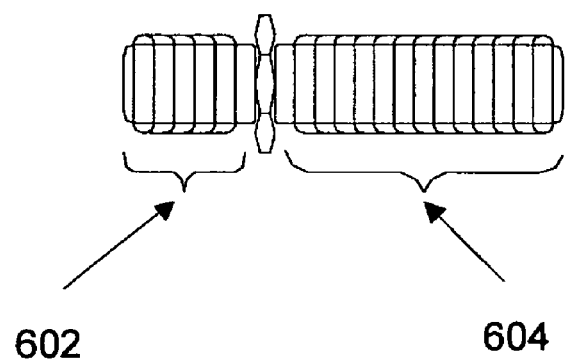
FIG. 6 illustrates an SMA-SMA connector-adapter that forms part of the high frequency wideband impedance probe in accordance with the present invention.

FIG. 6 illustrates an SMA-SMA connector-adapter that forms part of an exemplary calibrated high frequency wideband impedance probe in accordance with the present invention. After the probe is assembled, a first portion 602 of the illustrated SMA-SMA connector-adapter extends beyond probe body 106, and is available to interface with an external test cable. A second portion 604 of the SMA-SMA connector-adapter is inside probe body 106 when the probe is in its assembled state. Second portion 604 interfaces with internal semi-rigid coaxial cable 108 by threading inside locking nut 502, and screwing inside the SMA male connector of the semi-rigid coaxial cable 108.

Figure 7:
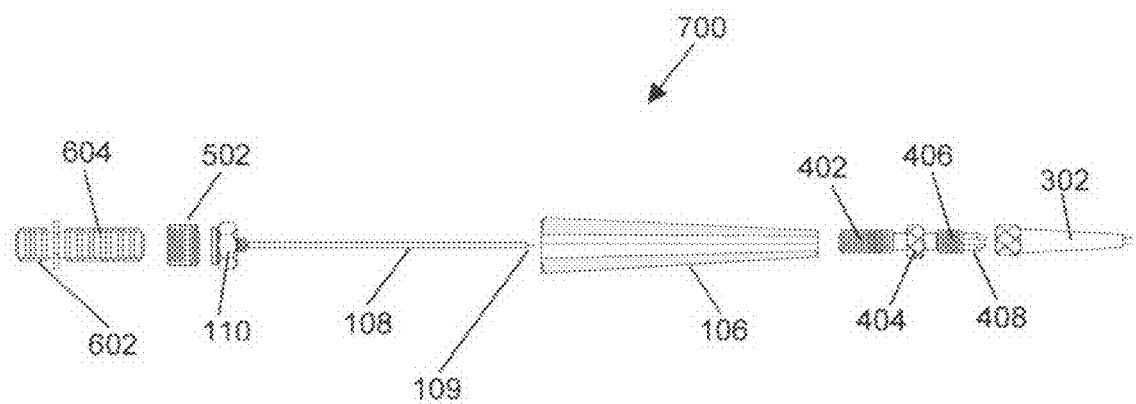
FIG. 7 is an exploded view of the various components in an illustrative embodiment of a high frequency wideband impedance probe in accordance with the present invention.

Referring to FIG. 7, an exploded view of the various components in an illustrative embodiment of a calibrated high frequency wideband impedance probe with an SMA external interface 700 in accordance with the present invention is shown. More particularly, starting from the left-hand portion of FIG. 7, the SMA-SMA connector-adapter is shown with second portion 604 aligned with locking nut 502; locking nut 502 is aligned with SMA male connector 110 at a second end of semi-rigid coaxial cable 108. The stripped center conductor 109 of semi-rigid coaxial cable 108 is shown aligned with the wide end of probe body 106. The narrower end of probe body 106 is aligned with second threaded portion 402 of component 400, and four-finger cable catch 408 is aligned with probe tip 302.

Figure 8:
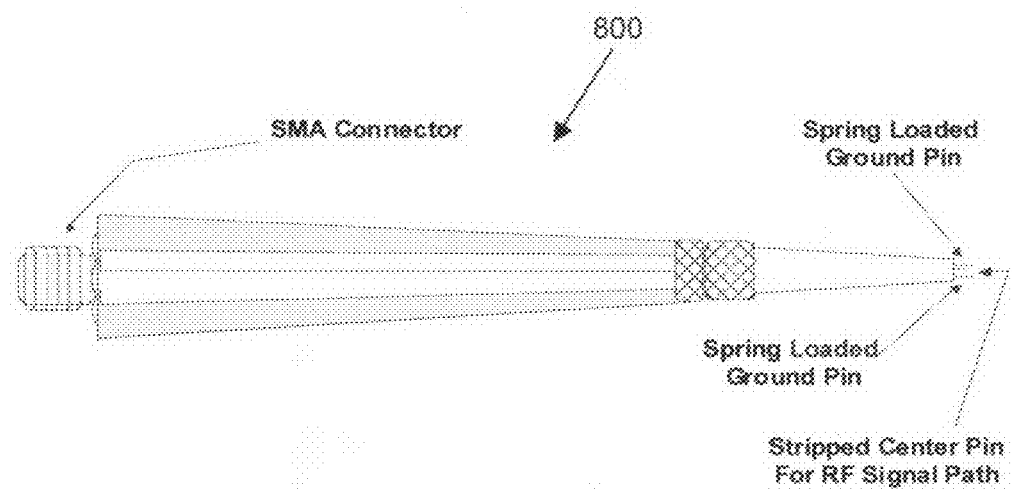
FIG. 8 illustrates a fully assembled high frequency impedance probe in accordance with the present invention.

FIG. 8 is related to FIG. 7 in that it illustrates the fully assembled state of the components shown in FIG. 7.

Figure 9:
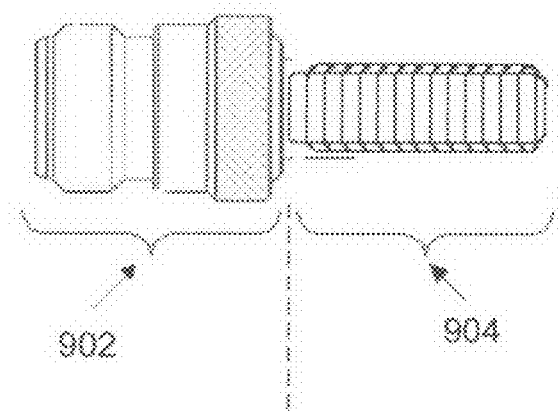
FIG. 9 illustrates a Type N Connector to SMA Connector adapter that forms part of the high frequency wideband impedance probe in accordance with the present invention.

In one aspect of the present invention and without making any changes to the probe body structure and dimensions, 50 ohm and 75 ohm impedance probes having type N connector for external interface with Type N test cables are produced. The SMA-SMA bulkhead of FIG. 6 is replaced with a precision custom made type N connector and SMA female adapter having the same length as the adapter portion of the SMA-SMA bulkhead as shown in FIG. 9. This is used to properly interface with 50 ohm or 75 ohm semi-rigid cable assemblies and the locking nut.

Referring to FIG. 9, a Type N connector to SMA connector adapter that forms part of the high frequency wideband impedance probe in accordance with the present invention is shown. It is noted that the adapter of FIG. 9 may be provided in either 50 ohm or 75 ohm versions. A first portion 902 of the adapter of FIG. 9, is the Type N portion, and a second portion 904 is the SMA portion. Portion 902 interfaces with an external test cable and portion 904 interfaces with internal semi-rigid coaxial cable 108. In the assembled state of the probe, first portion 902 extends outside of probe body 106, whereas second portion 904 is disposed inside probe body 106, and more particularly, second portion 904 screws inside locking nut 502 and attaches to semi-rigid coaxial cable 108.

Figure 10:
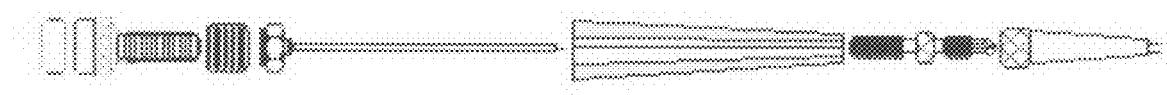
FIG. 10 is an exploded view of a Type N version high frequency impedance probe assembly in accordance with the present invention.

FIG. 10 is an exploded view of a Type N version high frequency impedance probe assembly in accordance with the present invention.

Figure 11:
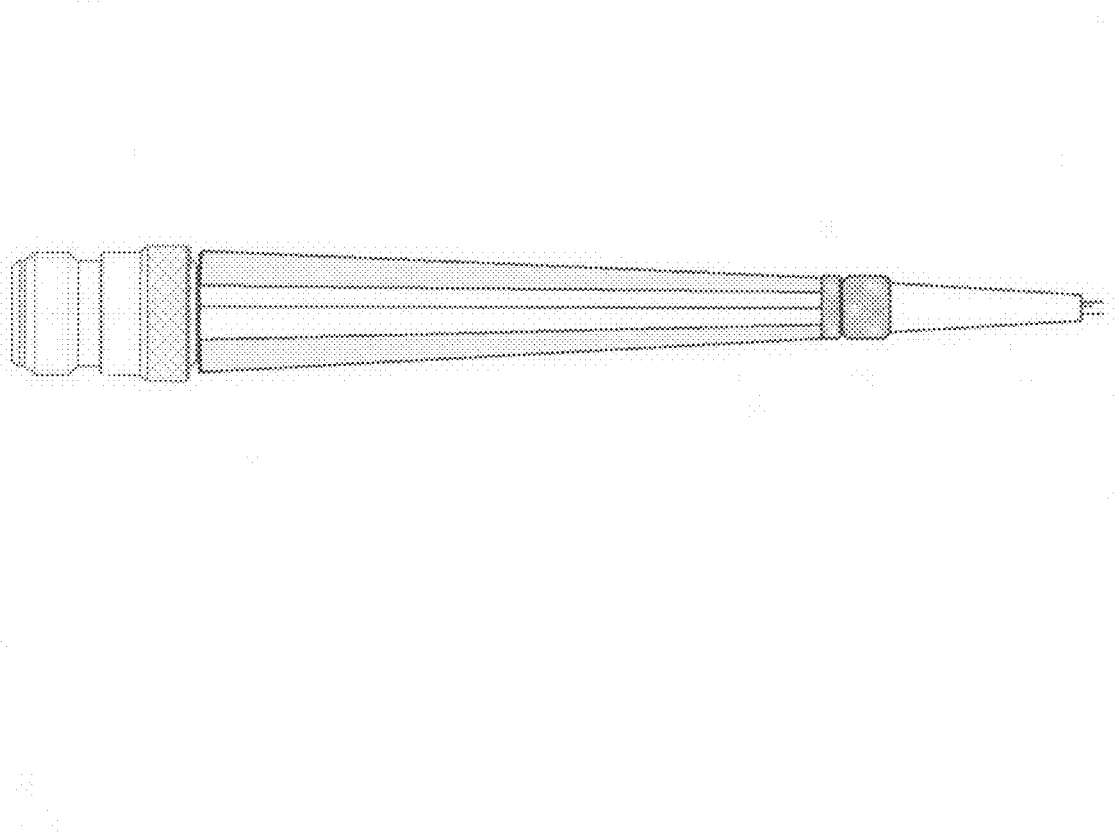
FIG. 11 illustrates a fully assembled Type N version of a high frequency passive impedance probe in accordance with the present invention.

FIG. 11 illustrates a fully assembled Type N version of a calibrated high frequency passive impedance probe in accordance with the present invention. It will be appreciated by those skilled in the art and having the benefit of the present disclosure that the Type N versions may be provided in both 50 ohm and 75 ohm impedance versions.

Figure 12:
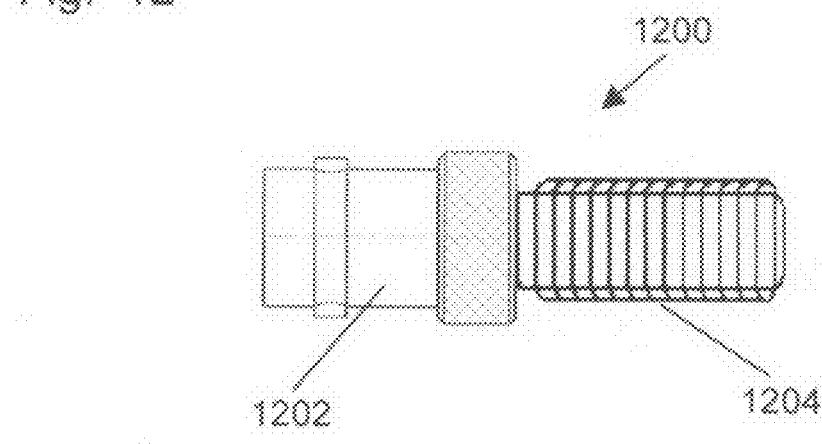
FIG. 12 illustrates a BNC connector to SMA connector adapter suitable for use in an embodiment of the present invention.

In another aspect of the present invention, and without making any changes to the probe body structure or dimensions, 50 ohm and 75 ohm impedance probes having BNC connectors for external interface with BNC test cables are produced. The SMA-SMA bulkhead of FIG. 6 is replaced with a precision custom made BNC connector and SMA female adapter having the same length as the adapter portion of the SMA-SMA bulkhead as shown in FIG. 12. This is used to properly interface with the 50 ohm and 75 ohm semi-rigid cable assemblies and the locking nut.

Referring to FIG. 12, a BNC connector to SMA connector adapter 1200 suitable for use in an embodiment of the present invention is shown. A first portion 1202 of adapter 1200 is a BNC connector and a second portion 1204 is the SMA connector portion.

Figure 13:
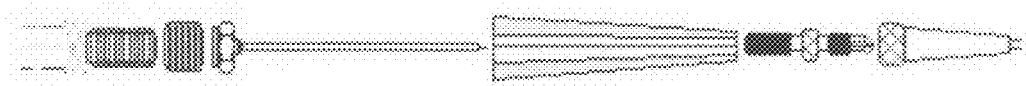
FIG. 13 is an exploded view of a BNC version high frequency passive impedance probe assembly in accordance with the present invention.
Figure 14:
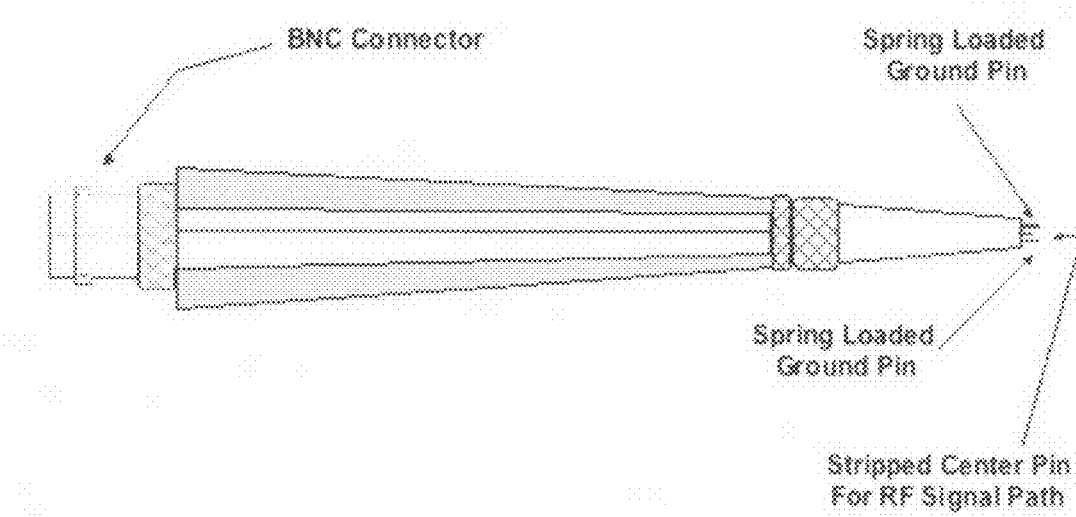
FIG. 14 illustrates a fully assembled BNC version of a high frequency passive impedance probe in accordance with the present invention.

FIG. 13 is an exploded view, and FIG. 14 illustrates a fully assembled view of the BNC version calibrated high frequency passive impedance probe assembly in accordance with the present invention.

In yet another aspect of the present invention, a calibration set for calibrating the probe includes 50 ohm and 75 ohm custom made precision loads and a shorting circuit. The calibration plane for the high frequency impedance probe is shown in FIG. 15. The high frequency passive impedance probe is calibrated in three steps: Step 1 includes terminating the probe with a 50 ohm or 75 ohm load depending on the probe impedance; Step 2 includes short-circuiting all three pins of the probe; and Step 3 includes open-circuiting all three pins of the probe. These three calibration steps are shown in FIG. 16.

FIG. 15 illustrates the calibration plane of a high frequency passive impedance probe in accordance with the present invention, in which the spring-loaded ground pins are pushed in.

FIG. 16 illustrates the loaded, short-circuited, and open-circuited configurations of an exemplary high frequency passive impedance probe in accordance with the present invention.

FIGS. 17A and 17B illustrate, respectively, side and front views of a precision load for calibration of the high frequency passive impedance probe.

FIGS. 18A and 18B illustrate, respectively, side and front views of short circuit plug for calibration of the high frequency passive impedance probe.

Figure 19:
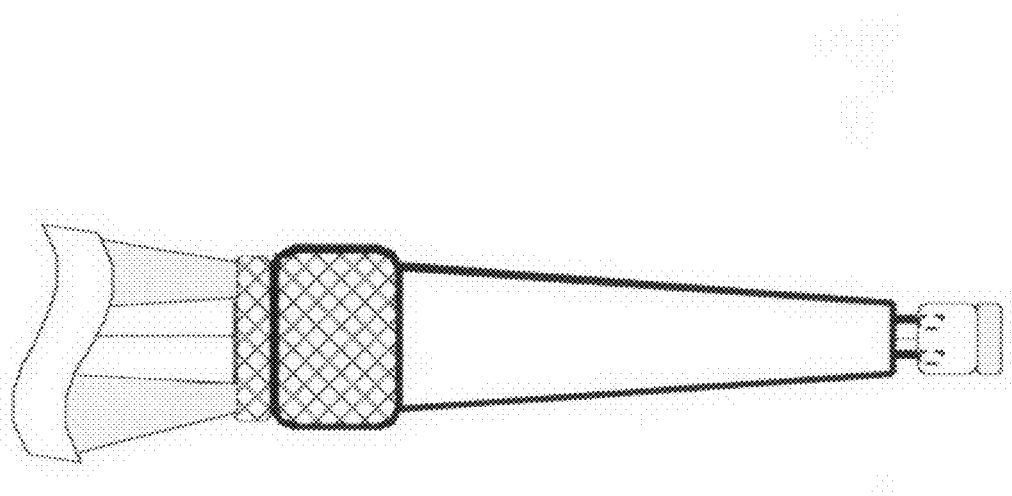
FIG. 19 shows a precision load mounted on the high frequency passive impedance probe for calibration thereof.

FIG. 19 shows a precision load mounted on the high frequency passive impedance probe for calibration thereof.

In one illustrative embodiment of the present invention, a high-frequency passive impedance probe, includes a low-loss semi-rigid coaxial cable assembly, the assembly comprising a coaxial cable of a first predetermined length, a first end portion thereof being stripped to expose a second predetermined length of a center conductor; and an SMA connector attached to a second end portion of the coaxial cable; a conically tapered, hexagonal shaped, hollow body, the body having a first end and a second end, the first end being wider than the second end; a probe tip coupled to the second end of the body, the probe tip including at least two spring-loaded ground pins; a four-finger threaded cable catch, the cable catch having a first portion disposed in the probe tip, and a second portion disposed in the probe body; a locking nut operable to secure the cable assembly and the SMA connector inside the probe body; and an SMA-RF connector-adapter coupled to the SMA connector.

In one illustrative method in accordance with the present invention, a method of calibrating a high-frequency passive impedance probe, wherein the impedance probe comprises a low-loss semi-rigid coaxial cable assembly, the assembly comprising a coaxial cable of a first predetermined length, a first end portion thereof being stripped to expose a second predetermined length of a center conductor; and an SMA connector attached to a second end portion of the coaxial cable; a conically tapered, hexagonal shaped, hollow body, the body having a first end and a second end, the first end being wider than the second end; a probe tip coupled to the second end of the body, the probe tip including at least two spring-loaded ground pins; a four-finger threaded cable catch, the cable catch having a first portion disposed in the probe tip, and a second portion disposed in the probe body; a locking nut operable to secure the cable assembly and the SMA connector inside the probe body; and an SMA-RF connector-adapter coupled to the SMA connector; the method including coupling the exposed portion of the center conductor and the at least two spring-loaded ground pins to a precision impedance load; determining the impedance seen by the probe; decoupling the precision impedance load from the center conductor and from the at least two spring-loaded ground pins; coupling the exposed portion of the center conductor and the at least two ground pins to a short circuit plug; determining the impedance seen by the probe; decoupling the short circuit plug; and determining the seen by the probe with the exposed portion of the center conductor and the at least two spring loaded ground pins in an open circuit configuration.

In one method in accordance with the present invention the precision impedance load includes a conductive body having first major surface, the first major surface having at least two recesses formed in an outer annular region thereof, the recesses adapted to receive at least a portion of the at least two spring-loaded ground pins; and the first major surface having a centrally located recess filled with a conductive material; and a second annular recess disposed between the conductive material and the outer annular region, the second annular recess substantially filled with a dielectric material; wherein the characteristic impedance of the precision impedance load is determined by the materials and dimensions of the conductive material and the dielectric material.

In one illustrative embodiment, a passive probe, includes a tapered probe cap having a first opening and a second opening; a tapered, hollow body; a coaxial cable with an exposed conductor tip at a first end thereof; an internally threaded collar, crimped onto a second end of the coaxial cable; a first cap-to-body connector, the first cap-to-body connector adapted receive and hold the coaxial cable; an externally threaded cylinder disposed adjacent to the internally threaded collar; a ring disposed around at least a portion of both the internally threaded collar, and the externally threaded cylinder; and a lock nut disposed on the externally threaded cylinder; wherein a first portion of the coaxial cable is disposed through the tapered hollow body, and a second portion of the coaxial cable is disposed through the first cap-to-body connector. In various embodiments, the coaxial conductor has an impedance of 50 Ohms, whereas in other embodiments and impedance of 75 Ohms is used. In some embodiments, the hollow body is made from an electrically insulating material.

CONCLUSION

An advantage of some embodiments of the present invention is providing a low-cost, easy-to-assemble, easy-to-use, calibrated, high-frequency, wide bandwidth, passive impedance probe.

Various embodiments of the present invention eliminate expensive RF connectors and the labor associated with soldering, and in some cases can eliminate the need for printed circuit boards, resulting in substantial savings, simplified testing procedure, and rapid test time. The high frequency calibrated impedance probe of the present invention can function as a complete portable RF port or interface. When attached to test cables, a pair of calibrated high frequency passive impedance probes turn into two flexible test arms virtually functioning as input and output RF test and measurement ports for any two-port RF and microwave passive and active circuits, devices, or modules, thus either eliminating test platforms, or significantly simplifying the test platforms.

It is to be understood that the present invention is not limited to the embodiments described above, but encompasses any and all embodiments within the scope of the subjoined Claims and their equivalents.

What is claimed is:

1. A high-frequency passive impedance probe, comprising:
a low-loss semi-rigid coaxial cable assembly, the assembly comprising
a coaxial cable of a first predetermined length, a first end portion thereof being stripped to expose a second predetermined length of a center conductor; and
an SMA connector attached to a second end portion of the coaxial cable;
a conically tapered, hexagonal shaped, hollow body, the body having a first end and a second end, the first end being wider than the second end;
a probe tip coupled to the second end of the body, the probe tip including at least two spring-loaded ground pins;
a four-finger threaded cable catch, the cable catch having a first portion disposed in the probe tip, and a second portion disposed in the probe body;
a locking nut operable to secure the cable assembly and the SMA connector inside the probe body; and
an SMA-RF connector-adapter coupled to the SMA connector.

2. The high-frequency passive impedance probe of claim 1, wherein the center conductor is silver plated, the outer ground conductor is silver plated, and the dielectric material separating the center conductor and outer ground conductor is Teflon.

3. The high-frequency passive impedance probe of claim 1, wherein the SMA connector is a male connector.

4. The high-frequency passive impedance probe of claim 1, wherein the hexagonal body comprises black anodized aluminum having a raised texture on the outer surface thereof.

5. The high-frequency passive impedance probe of claim 1, wherein the probe tip comprises gold-plated aluminum.

6. The high-frequency passive impedance probe of claim 1, wherein the SMA-RF connector-adapter is an SMA connector to SMA connector adapter.

7. The high-frequency passive impedance probe of claim 1, wherein the SMA-RF connector-adapter is a BNC connector to SMA connector adapter.

8. The high-frequency passive impedance probe of claim 1, wherein the SMA-RF connector-adapter is a Type N connector to SMA connector adapter.

9. The high-frequency passive impedance probe of claim 1, further comprising a precision calibration load coupled to the at least two spring loaded ground pins, and further coupled to the stripped center conductor.

10. The high-frequency passive impedance probe of claim 1, further comprising a short circuit plug coupled to the at least two spring loaded ground pins, and further coupled to the stripped center conductor.

11. A method of calibrating a high-frequency passive impedance probe, wherein the impedance probe comprises a low-loss semi-rigid coaxial cable assembly, the assembly comprising a coaxial cable of a first predetermined length, a first end portion thereof being stripped to expose a second predetermined length of a center conductor; and an SMA connector attached to a second end portion of the coaxial cable; a conically tapered, hexagonal shaped, hollow body, the body having a first end and a second end, the first end being wider than the second end; a probe tip coupled to the second end of the body, the probe tip including at least two spring-loaded ground pins; a four-finger threaded cable catch, the cable catch having a first portion disposed in the probe tip, and a second portion disposed in the probe body; a locking nut operable to secure the cable assembly and the SMA connector inside the probe body; and an SMA-RF connector-adapter coupled to the SMA connector; the method comprising:
   coupling the exposed portion of the center conductor and the at least two spring-loaded ground pins to a precision impedance load;
   determining the impedance seen by the probe;
   decoupling the precision impedance load from the center conductor and from the at least two spring-loaded ground pins;
   coupling the exposed portion of the center conductor and the at least two ground pins to a short circuit plug;
   determining the impedance seen by the probe;
   decoupling the short circuit plug;
   determining the seen by the probe with the exposed portion of the center conductor and the at least two spring loaded ground pins in an open circuit configuration.

12. The method of claim 11, wherein the precision impedance load has a 50 ohm impedance.

13. The method of claim 11, wherein the precision impedance load has a 75 ohm impedance.

14. The method of claim 11, wherein the short circuit plug comprises aluminum plated with nickel, and the nickel is plated with gold.

15. The method of claim 11, the precision impedance load comprises a conductive body having first major surface, the first major surface having at least two recesses formed in an outer annular region thereof, the recesses adapted to receive at least a portion of the at least two spring-loaded ground pins; and the first major surface having a centrally located recess filled with a conductive material; and a second annular recess disposed between the conductive material and the outer annular region, the second annular recess substantially filled with a dielectric material; wherein the characteristic impedance of the precision impedance load is determined by the materials and dimensions of the conductive material and the dielectric material.

* * * * *